United States Patent [19]
Hornak et al.

[11] Patent Number: 5,438,621
[45] Date of Patent: Aug. 1, 1995

[54] DC-FREE LINE CODE AND BIT AND FRAME SYNCHRONIZATION FOR ARBITRARY DATA TRANSMISSION

[75] Inventors: Thomas Hornak, Portola Valley; Patrick Petruno, San Jose; Richard C. Walker, Palo Alto; Benny W. H. Lai, San Jose; Chu-Sun Yen, Palo Alto; Cheryl L. Stout, Fremont, all of Calif.; Jieh-Tsorng Wu, Taipei, Taiwan

[73] Assignee: Hewlett-Packard Company, Palo Alto, Calif.

[21] Appl. No.: 857,924

[22] PCT Filed: Nov. 13, 1991

[86] PCT No.: PCT/US91/08483
§ 371 Date: May 5, 1992
§ 102(e) Date: May 5, 1992

[87] PCT Pub. No.: WO92/09162
PCT Pub. Date: May 29, 1992

Related U.S. Application Data

[63] Continuation-in-part of Ser. No. 612,746, Nov. 13, 1990, abandoned, which is a continuation-in-part of Ser. No. 266,459, Nov. 2, 1988, Pat. No. 5,022,051.

[51] Int. Cl.[6] ............................................. H04L 25/49
[52] U.S. Cl. ....................................... 380/43; 361/246; 371/55; 375/287
[58] Field of Search .................. 375/19, 17, 20, 106, 375/113, 114; 371/55, 56, 2.1; 341/93; 370/82; 361/245, 246

[56] References Cited

U.S. PATENT DOCUMENTS 4,216,426 8/1980 Flora .
4,408,189 10/1983 Betts et al. .
4,464,765 8/1984 Shimizu .
4,682,334 7/1987 Le Mouel et al. .
4,926,447 5/1990 Corsetto et al. .
5,022,051 6/1991 Crandall et al. .

FOREIGN PATENT DOCUMENTS 3526051 7/1985 Germany .................. H03M 7/14
3531991 9/1985 Germany .................. H04L 5/22
2099263 12/1982 United Kingdom ........ H03K 13/24

OTHER PUBLICATIONS

"Clock Recovery for a 5 Gbit/s Fibre-Optic System" in *Electronic Letters* 24th Jun. (1982) vol. 18, No. 13.

"Clock Recovery from Random Binary Signals" in *Electronic Letters* 30th Oct. (1975) vol. 11, No. 22.

"A Self Correcting Clock Recovery Circuit", C. R. Hogge, Jr., in *IEEE Transactions on Electron Devices*, vol. ED-32, No. 12, Dec. 1975.

Walker et al., "A Chipset for Gigabit Rate Data Communication", IEEE Proceedings of the 1989 Bipolar Circuits and Technology Meeting, Sep. 1989, pp. 288-290.

*Primary Examiner*—Stephen Chin
*Assistant Examiner*—Hai H. Phan

[57] ABSTRACT

A method of encoding data for transmission over a communication link. A cumulative polarity of previously-transmitted frames is maintained. A frame is prepared for transmission by combining a data word with a plurality of additional bits. The additional bits provide a master transition. A phantom bit is encoded in the additional bits. If the polarity of the frame is the same as the cumulative polarity, the data bits or in some instances all the bits are inverted so as to maintain balance. Control words and fill words are provided and are distinguished from data words by encoding the additional bits. Control words carry additional data or control instructions and are distinguished from fill words by the number of transitions. The phantom bit either conveys additional data or is used for such purposes as error checking.

23 Claims, 4 Drawing Sheets

DC-FREE LINE CODE AND BIT AND FRAME SYNCHRONIZATION FOR ARBITRARY DATA TRANSMISSION

CROSS-REFERENCE TO RELATED APPLICATIONS

This application is a continuation-in-part of copending U.S. patent application Ser. No. 07/612,746, filed Nov. 13, 1990 abandoned, which in turn is a continuation-in-part of U.S. patent application Ser. No. 07/266,459, filed Nov. 2, 1988, now U.S. Pat. No. 5,022,051, issued Jun. 4, 1991. This application is generally related to U.S. Pat. No. 4,926,447, issued May 15, 1990. Said U.S. Patents are incorporated herein by this reference.

BACKGROUND OF THE INVENTION

This invention pertains generally to the transmission of data and more particularly to a method of encoding digital data to provide a balanced serial data stream that includes bit and frame synchronization control.

Digital data must often be transmitted from one location to another over a communication link. There is a continuing need for systems that can transmit large quantities of data rapidly from point to point, and this has led to the development of very high-speed communication links such as optical fibers and their associated electro-optical components.

It is preferable that a stream of data be encoded for transmission in such a manner that the data stream is balanced. "Balanced" means that over time the stream includes an equal number of logical one bits and logical zero bits. In electrical signal terms, a balanced data stream does not have a DC component whereas an unbalanced stream has a DC component.

Balanced data permits the use of AC-coupled circuits in the communication link. Many communication links do not perform satisfactorily—in fact, some do not perform at all—unless AC-coupled circuits can be used. For example, it may be necessary to use a transformer (an AC coupling device) to prevent ground loops and to reduce common mode signals.

In addition, a laser element in a high-speed fiber optic transmitter requires a regulated drive current. If the laser carries balanced data, the average drive current is independent of the data and therefore is easier to regulate than would be the case if unbalanced data were transmitted. Also, it is easier to separate balanced data from DC bias currents in an optical receiver. Accordingly there has been a need for a method of encoding digital data so that the resulting data stream is balanced before providing the data to a transmitter in a communication link.

A receiver in a digital communication link must be synchronized with an incoming digital signal so that it can extract frame and bit timing information from the signal. This timing information is then used to recover the actual data. Therefore, in addition to the requirement that the data stream be balanced, there is a requirement that the data be encoded in such a way that the receiver can be synchronized with the incoming signal. Such synchronization may be accomplished, for example, by means of a phase-lock loop ("PLL") circuit such as that described in the aforementioned U.S. Pat. No. 4,926,447.

It is also desirable to communicate various control signals to the receiver. These signals may convey additional information or they may be used to regulate the operation of the receiver itself.

A method of providing a balanced data stream is described in Carter, R. O., "Low-Disparity Binary Coding System," *Electronic Letters*, May 1965, Vol. 1, No. 3, pp 67–68. Briefly, groups of bits are inverted as needed to maintain a balance between the average number of logical one bits and logical zero bits carried by the communication link. An indicator bit is appended to each group to indicate whether that group is being transmitted in inverted form.

An improved version of this method, and apparatus for implementing it, are described in the aforementioned U.S. Pat. No. 5,022,051. This patent also discloses appending a small plurality of M bits to each data word. These appended bits may be used, for example, to indicate whether the data bits have been inverted and they may carry a "master transition" which always occurs in the same relative position in each word for use by the receiver in establishing synchronization with the incoming data stream.

A transition is defined by a change in the logic levels of two adjacent bits. The polarity of a transition is either positive-going, as in a change from a logical zero to a logical one, or negative-going.

Typically, it has been required that a master transition always have the same polarity. Two bits are required to define a master transition that always has the same polarity. The information content of a data stream could be increased by providing a master transition that could be of either polarity.

It is desirable to provide a method of checking an incoming signal for errors. This has been done by transmitting additional bits such as parity bits that can be used by the receiver to determine whether the received signal contains any errors. However, these bits carry no primary information and using them results in some degradation of the maximum rate at which data can be transmitted.

From the foregoing it will be apparent that there remains a need for a way to encode data so as to provide a balanced data stream that provides a high rate of data transfer and that facilitates receiver synchronization and control and error checking.

SUMMARY OF THE INVENTION

The present invention provides a novel method of encoding digital data into a balanced data stream that affords a high rate of data transfer and that facilitates receiver synchronization and control and error checking with only a minimal reduction in the data rate.

Briefly and in general terms, a method of encoding data according to the invention includes maintaining a cumulative polarity of bits which have previously been transmitted, forming a frame by combining a data word with a group of additional bits, using at least one of the additional bits to define a master transition in a fixed location in the frame, and setting the logical values of the combined bits such that the frame has a different polarity than the cumulative polarity.

As used in this description, the "polarity" of a frame has one value (say, positive) if the frame contains more logical one bits than logical zero bits and a different value (negative) if the frame contains fewer logical one bits than logical zero bits. If the frame has equal numbers of logical one bits and logical zero bits, the polarity is considered to be neutral. Similarly, the cumulative polarity is positive if more logical one bits than logical zero bits have been transmitted, negative if fewer logical one bits than logical zero bits have been transmitted, and neutral if equal numbers of both kinds of bits have been transmitted.

In a preferred embodiment a further bit is transmitted by encoding it into the additional bits as a "phantom" bit. Thus, even though the further bit is not concatenated onto the bits to be transmitted, its logical value is carried by the additional bits and may be recovered by the receiver. This further bit may serve as another data bit to increase the data rate or it may be used for such other purposes as control or error checking, for example by varying its value from one frame to the next according to a predetermined error-checking pattern.

Preferably the frame polarity is set opposite the cumulative polarity by inverting the logical values of the data bits and encoding the additional bits to indicate whether the logical values of the data bits have been inverted if the frame polarity would otherwise be the same as the cumulative polarity. If either the frame polarity or the cumulative polarity is neutral, the bits may be inverted or not as may be convenient.

In an alternative, if it is necessary to invert the logical values to maintain a balanced data stream, all the bits in the frame are inverted. In this case, the logical level of one of the additional bits may be used as an indicator of whether the bits have been inverted.

In another embodiment, the order of the bits is scrambled before transmission according to a predetermined pattern and unscrambled after reception. An unauthorized receiver, not having the pattern, would not be able to reconstruct the data.

One or another of the bits adjacent the bits which define the master transition are preferably set to the same values as the bits which define the master transition from time to time as frames are transmitted so that the master transition is not always surrounded by other transitions. This tends to prevent the receiver from inadvertently staying locked onto a transition other than the master transition without detection of such an error.

Control words and fill words may be transmitted in addition to data words. A control word carries either information or control signals as desired. A fill word has only one transition in addition to the master transition and is used to establish synchronization and thereafter if necessary to maintain or reestablish synchronization. The fill words are balanced or are used in balanced pairs such that polarity need not be checked and the logical values of fill bits need not be inverted. The logical values of the additional bits indicate which type of word is being transmitted; in addition, a bit within a word, for example one or more bits in a control word, may be used to distinguish a control word from a fill word.

The master transition in the fill word typically is always of the same polarity. This facilitates synchronization of the receiver. After synchronization has been attained, master transitions of either polarity are sufficient to maintain synchronization.

Other aspects and advantages of the present invention will become apparent from the following detailed description, illustrating by way of example the principles of the invention.

DESCRIPTION OF THE PREFERRED EMBODIMENTS

The present invention is embodied in a novel method of encoding digital data for transmission over a communication link. There has been a need for a method of encoding data that provides a balanced data stream including timing and control signals with minimum degradation of the data rate.

In the following discussion, an embodiment having 16 data bits and 4 additional bits is described. Naturally, it will be apparent that other numbers of data bits and additional bits may be used as desired. Also, the additional bits are shown as being appended to the data bits, but in fact the bits can be interspersed and arranged in any convenient order as may be convenient.

Figure 1:
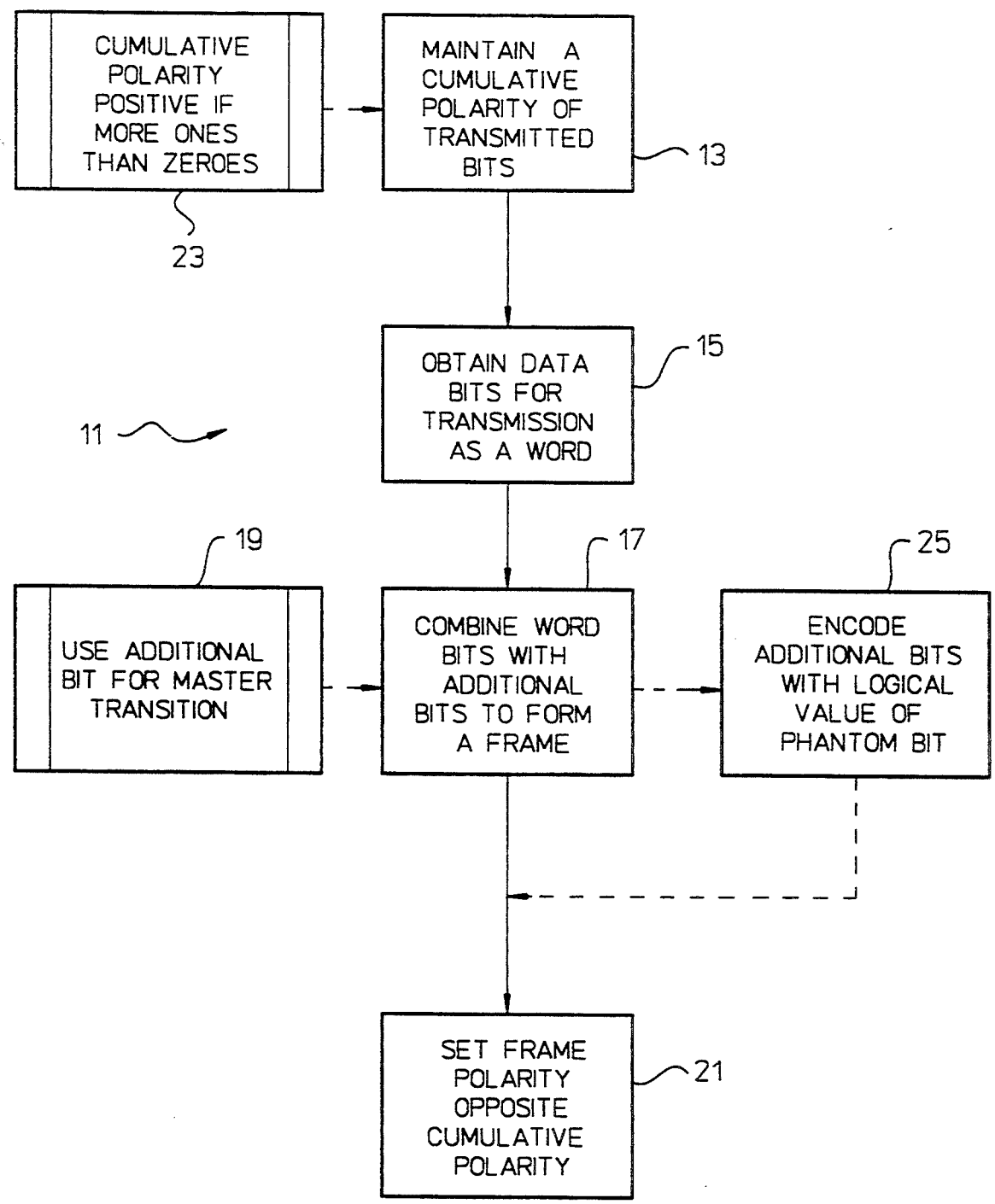
FIG. 1 is a flowchart depicting a first embodiment of the method of the invention.

In a first preferred embodiment of the invention, depicted in flowchart form in FIG. 1, a method (generally 11) of encoding a digital bit stream for transmission over a communication link comprises maintaining (13) a cumulative polarity indicative of bits which have been transmitted over the link during a predefined time interval, obtaining (15) a plurality of data bits from the stream for transmission as a data word, and forming (17) a frame by combining the data bits with a plurality of additional bits, a predetermined one of the additional bits having a logical value opposite that of an adjacent bit such that said two bits establish (19) a master transition in a predetermined location in the frame, and setting (21) the logical values of the combined bits such that the frame has a different polarity than the cumulative polarity.

For convenience, the frame polarity is referred to herein as "positive" if the frame contains more logical one bits than logical zero bits and "negative" if the frame contains fewer logical one bits than logical zero bits. Similarly, the cumulative polarity is positive if more logical one bits than logical zero bits have been transmitted and negative if fewer logical one bits than logical zero bits have been transmitted. This is indicated by a block 23 in FIG. 1.

The time interval during which the cumulative polarity is maintained usually begins when transmission begins and continues until the frame immediately prior to the frame being formed. However, it may be desirable to maintain the cumulative polarity over a lesser time interval, for example until the second prior frame, to permit more rapid signal processing in the transmitter circuits.

Preferably, the method includes encoding a further bit as a phantom bit and encoding (25) the additional bits to indicate the logical value of the phantom bit. The further bit is used as another data bit or for other purposes.

Setting the logical values preferably comprises inverting the logical values of the data bits and encoding the additional bits to indicate whether the logical values of the data bits have been inverted if, but for such inversion and encoding, the frame polarity would be the same as the cumulative polarity. Thus, the polarity of the frame is compared with the cumulative polarity and if they are the same then the data bits are inverted and the additional bits are encoded to indicate that inversion has taken place.

Alternatively, setting the logical values comprises inverting the logical values of all the bits if, but for such inversion, the frame polarity would be the same as the cumulative polarity.

In one embodiment the additional bits in each of a plurality of frames are encoded according to a predetermined error-checking pattern. Thus, the received frames may be checked for errors by comparing the additional bits in the received frames with said pattern.

Prior to transmission, the order of the bits may be scrambled according to a predetermined security pattern. Upon reception the bits are unscrambled according to said pattern to recover the data word. If the transmission is intercepted by an unauthorized receiver not knowing the security pattern, the receiver will not be able to recover the data.

Preferably, care is taken from time to time as frames are being transmitted to select different logical values for bits adjacent the two bits which establish the master transition. This prevents the receiver from inadvertently locking on to a transition that is adjacent the master transition.

Figure 2:
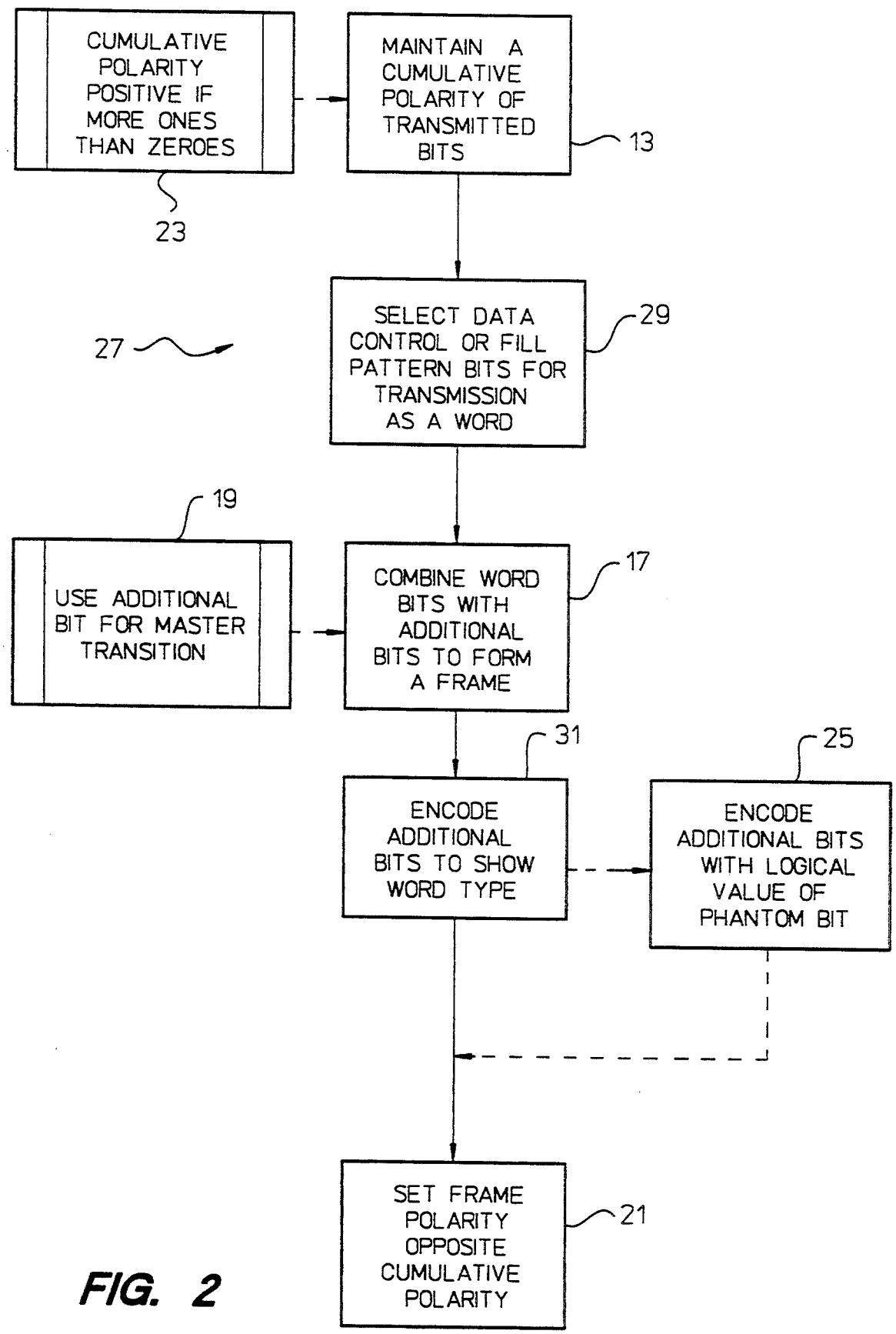
FIG. 2 is a flowchart depicting a second embodiment of the method of the invention.

Another preferred embodiment (generally 27) os depicted in flowchart form in FIG. 2. This embodiment is similar in some respects to the embodiment shown in FIG. 1, and for convenience similar elements have been given the same reference numerals. In this embodiment, either a data word, a control word, or a fill word may be selected (29) for transmission. The fill word is normally defined together with a specific set of additional bits to provide a fill frame that typically has only a single transition in addition to the master transition. A control word carries information much as does a data word; this information may be used as data or may be used to provide control signals for other purposes.

The additional bits are encoded (31) in such a way as to indicate whether the word is a data word, a control word or a fill word. These additional bits may be encoded the same way for either a control word or a fill word. In this case, two bits of the control word are used to provide a second transition somewhere in the word, thereby distinguishing the control word from a fill word.

A fill frame may be a balanced frame, which is essentially a square wave having a 50% duty cycle. Alternatively, the fill frame may be selected from a related group of predefined fill frame patterns, at least one pattern having more zeros than ones, at least one pattern having more ones than zeros, and the total quantity of ones in all the patterns being equal to the total quantity of zeros in all the patterns. Which pattern to use is determined, for example, according to whether the frame pattern has a different polarity than the cumulative polarity. Alternatively, the patterns are alternated so as to maintain balance.

If desired, the receiver checks the polarity of a master transition in a received fill word to obtain synchronization and thereafter checks only the existence, not the polarity, of master transitions in received data and control words to maintain synchronization.

In the following discussion, the letters "N" and "M" are used to refer to the data bits and the additional bits, respectively, in a frame. The "N" bits may also refer to the control bits in a control word or to the bits that make up a fill word.

Data Transmission

When transmitting data, a frame of N plus M bits may take on one of four possible alternatives, as depicted in Table 1.

Referring to Table 1, the M appended bits are m1 through m4, the N data bits are bits A through P, and X denotes a user definable bit value. As depicted in Table 1, the M appended bits perform several functions. First, they indicate whether the N data bits are true or inverted. Secondly, they provide a Master Transition between appended bits m2 and m3. Thirdly, the M appended bits provide a phantom bit capable of representing a logical 0 or a logical 1 data value. As used in this specification, the term "phantom bit" means a bit which can be encoded into and extracted from the M appended bits. The phantom bit can be a user definable bit, such as an additional data bit or some type of control or indicator bit desired by the user. Alternatively, the phantom bit can be a bit utilized by the transmitter and receiver of the communications link, for example for defining the extent of "superframes", as more fully described below. In practice, an N+1st bit on the transmitter side of the link is used to set the value of the phantom bit and, as a result, together with the status of the N data bits as being either true or inverted (selected in order to tend to balance the number of logical 0s and logical 1s transmitted over the link) the M appended bits m1 through m4 are selected according to the definition depicted in Table 1. In other words, on the transmitter side, when phantom bit has its first value, the M appended bits shown in one of the first two lines of Table 1 are transmitted. When the phantom bit has its second value, the M appended bits shown in one of the last two lines of Table 1 are transmitted. The selection of which of these two lines (line 1 or line 2; line 3 or line 4 of Table 1) are transmitted depends on whether the data bits in the frame associated with the M appended bits have been or have not been inverted before transmission in order to balance the link.

Referring again to Table 1 it is seen that, in accordance with the teachings of this invention, regardless which of the four possible sets of M appended bits is transmitted, there is a transition between appended bits m2 and m3. This transition serves as the Master Transition which is detected on the receiver side for bit and frame synchronization. Of importance, the receiver side of the link must accommodate consecutive Master Transitions which are not of uniform polarity, as the Master Transition between appended bits m2 and m3 in adjacent frames can be of varying polarity.

Furthermore, in accordance with the teachings of this invention, if the value of the phantom bit is frequently alternated, the boundary between bits m1 and m2 and the boundary between bits m3 and m4 alternate frequently between transition and nontransition, and vice versa. In this manner the receiver side of the link, which expects a Master Transition in every frame between bits m2 and m3, cannot get permanently erroneously phase-locked to a transition immediately adjacent to the true Master Transition. This is an improvement over the teachings of the aforementioned U.S. Pat. No. 4,926,477, where the bit boundaries immediately adjacent to the true Master Transition could be a similar transition as the Master Transition over an unlimited number of frames. In order to effect this advantage, it is not necessary that the phantom bit change its value with each frame. Therefore, the phantom bit can represent actual user supplied data desired to be transmitted over the communications link so long as there is some assurance or likelihood that that data which is to be represented by the phantom bit will, in fact, change its value fairly frequently.

In one embodiment of this invention, the phantom bit is used to define superframes, i.e., frames including Q*N bits, where Q is the number of frames forming a superframe. In this embodiment, for example, a frame containing a phantom bit of the first value indicates the beginning of a superframe, and frames including phantom bits of the second value indicate subsequently transmitted frames contained within the superframe. For example, a first frame of the superframe includes a phantom bit of the first value indicating the beginning of the superframe, and Q−1 subsequent frames each include a phantom bit of the second value. In this embodiment, the proper sequence of the M additional bits is automatically checked on the receiver side of the communications link and single bit errors in the set of M appended bits are immediately detected. For example, for Q=4, the receiver should always receive once during a superframe bits m1 through m4 corresponding to one of the two choices associated with a phantom bit of a first value, and three times during the superframe bits m1 through m4 corresponding to one of the two choices associated with a phantom bit of the second value. In those instances, when a control word is sent within a superframe, such that the superframe includes Q frames plus the one or more control word frames, the detection of the appropriate number of phantom bits of the first and second values is made without regard to the control word frames.

Control Words

In this embodiment, one example of a technique for transmitting non-data words, such as control words, is depicted in Table 2.

In this embodiment, when sending control words over the communications link, only N−2 bits are available to the user because the two center bits (bits H and I) of the control word are preset in accordance with whether the control word has been inverted or not in an attempt to balance the bits sent over the communications link. In this embodiment, when sending control words the phantom bit is not available, as there are only two possible choices of bit patterns for the M appended bits, corresponding with an indication of whether the N−2 available bits contained within the control word have been inverted.

In this embodiment, it is seen from Table 2 that regardless of whether the control word has been or has not been inverted prior to transmission, the boundary between bits m2 and m3 forms a Master Transition of non-uniform polarity. In other words, the Master Transition can be a positive going or a negative going transition. Furthermore, by carefully choosing the two choices of the M appended bits as shown in Table 2, it is not possible for the phase-locked loop on the receiving end of the communications link to erroneously lock to the boundaries between bits m1 and m2, or the boundary between bits m3 and m4 because, as shown in Table 2, there is no transition at these boundaries when transmitting control words.

Fill Words

When neither data nor control words are available for transmission, Fill Words must be transmitted to maintain bit and frame synchronization at the receiving end. Furthermore, during start-up of the communications link, Fill Words are transmitted as a training sequence in order to achieve proper phase/frequency lock on the receiving end. In one embodiment, as described in the aforementioned U.S. Pat. No. 4,926,447, during start-up of a full duplex link, two distinguishable Fill Words are utilized. These two Fill Words are herein denoted as Fill Word 0; and Fill Word 1.

Fill Word 0 is encoded as shown in Table 3. The transmitted frame containing Fill Word 0 has an equal number of ones and zeros, and thus, it does not cause any additional imbalance between ones and zeros which have been previously transmitted over the communications link.

Fill Word 1 includes two options, Fill Word 1a and Fill Word 1b, as depicted in Table 4. Fill Word 1a has two more ones than zeros; conversely, Fill Word 1b has two more zeros than ones. Therefore, Fill Word 1a is utilized as Fill Word 1 when bits previously transmitted over the communications link have been unbalanced such that more zeros than ones had been transmitted. Conversely, Fill Word 1b is used as Fill Word 1 when the opposite is true. In one embodiment of this invention, the selection of Fill Word 1a or 1b as Fill Word 1 is made with reference to the imbalance of the data bits previously transmitted over the communications link without considering the contribution to the imbalance of one or more immediately preceding frames. In this embodiment, the choice of Fill Words 1a or 1b still operates to provide an overall DC balance, while avoiding potential delays which might otherwise be required if even the most immediately preceding frame were to be considered in determining imbalance for the purposes of selecting Fill Word 1a versus 1b. In another alternative embodiment, Fill Words 1a and 1b are alternated without regard to the actual imbalance of previously transmitted bits as long as each cycle of alternation causes no net change in the balance. In another embodiment, Fill Words 1a and 1b are not used, and Fill Word 0 is always used as a Fill Word, thereby not affecting a previous imbalance of the link.

As shown in Tables 3 and 4, for all Fill Words, there is only one transition of a first polarity (the Master Transition) and only one transition of a second polarity opposite the first polarity. In accordance with this embodiment of the present invention, the phase locked loop on the receiver side of the communications link serves such that during the startup of the communications link when Fill Words are used as a training sequence and thus before lock is achieved, the phase lock loop accepts only a transition of the first polarity as a Master Transition, thus insuring that the phase lock loop will unambiguously lock on the Master Transition. Only after lock is achieved does the phase lock loop on the receiving side of the communications link accept transitions of either polarity as a true Master Transition, as may be legitimately be the case during transmission of data words or control words, as described above.

Bit Error Detection

In addition to the features described above which either minimize or avoid false locking of the phase lock loop on the receiving side of the communications link, and the error detection feature when utilizing the phantom bit to define superframes, in accordance with the teachings of this invention, additional error detection is provided. Table 5 depicts a plurality of frames which are erroneous in that they can never legitimately be transmitted over the communications link. Therefore, if the receiver detects any of the frames depicted in Table 5, it is known that that frame is in error. If desired, an indication of such error is made to the transmitter.

Proprietary Encoding

It is often desirable to provide security in a communications link such that undesired persons cannot properly detect the transmitted data. The teachings of this invention are readily adaptable to such situations in that transmitting and receiving circuitry can be easily personalized for a given user such that a given transmitter/receiver pair are able to effectively communicate with each other but such that other transmitters and receivers which are not personalized in precisely the same manner would be effectively prevented from communicating with an authorized transmitter or receiver. When transmitter encoding and receiver decoding circuitry are fabricated as integrated circuits, the integrated circuits can be easily personalized as desired. Preferably, the personalization step is performed as a late processing step during the fabrication of the integrated circuit, for example, by a personalized last metal mask. This technique allows a number of devices to be fabricated in a routine manner and, if desired, inventoried while allowing personalization to be performed without unduly disrupting the fabrication sequence. Alternatively, well-known switching and programming techniques can be utilized on the integrated circuit itself in order to allow programming of the integrated circuit to be effected following complete fabrication of the integrated circuit.

In one embodiment of this invention, transmitter encoding and receiver decoding circuits are made incompatible with other devices while remaining compatible with each other, by uniquely scrambling (in the transmitter) and descrambling (in the receiver) the sequence of bits as they are converted from parallel data words to a serial bit stream in the transmitter, and when they are converted from a received serial bit stream to parallel data words in the receiver.

In one embodiment, bit scrambling is achieved by including at least one of the M additional bits in the scrambling pattern. This provides optimal security because the M bits are not as readily available to an interceptor as are the N bits. Furthermore, when the transmitter encoder and receiver decoder are fabricated as integrated circuits, the M additional bits are not available even to one who is seeking to break the proprietary encoding scheme. It may be preferable to scramble only some words, for example, all words except the fill words. It will be apparent that the master transition must be in the same relative position in all frames, and if the fill words are not scrambled then the position of the master transition must not be changed during scrambling of the other words.

Table 6 illustrates a few simple examples of personalized scrambling techniques, each of which may be treated as a secure scrambling technique with respect to each other and with respect to an unscrambled bit stream. If desired a more complex bit swapping technique can be used, for example, such that three or more bits are swapped rather than only two.

Various transmitter and receiver circuit configurations may be used to encode and decode data for transmission according to the methods of the invention. Several such circuit configurations are disclosed in the previously-mentioned U.S. Pat. No. 5,022,051. The circuit configuration illustrated in FIGS. 12 and 13 of said patent is reproduced herein for reference in FIGS. 3 and 4, respectively. The circuitry of FIGS. 3 and 4 will now be briefly described (a more detailed description may be found in said patent).

Figure 3:
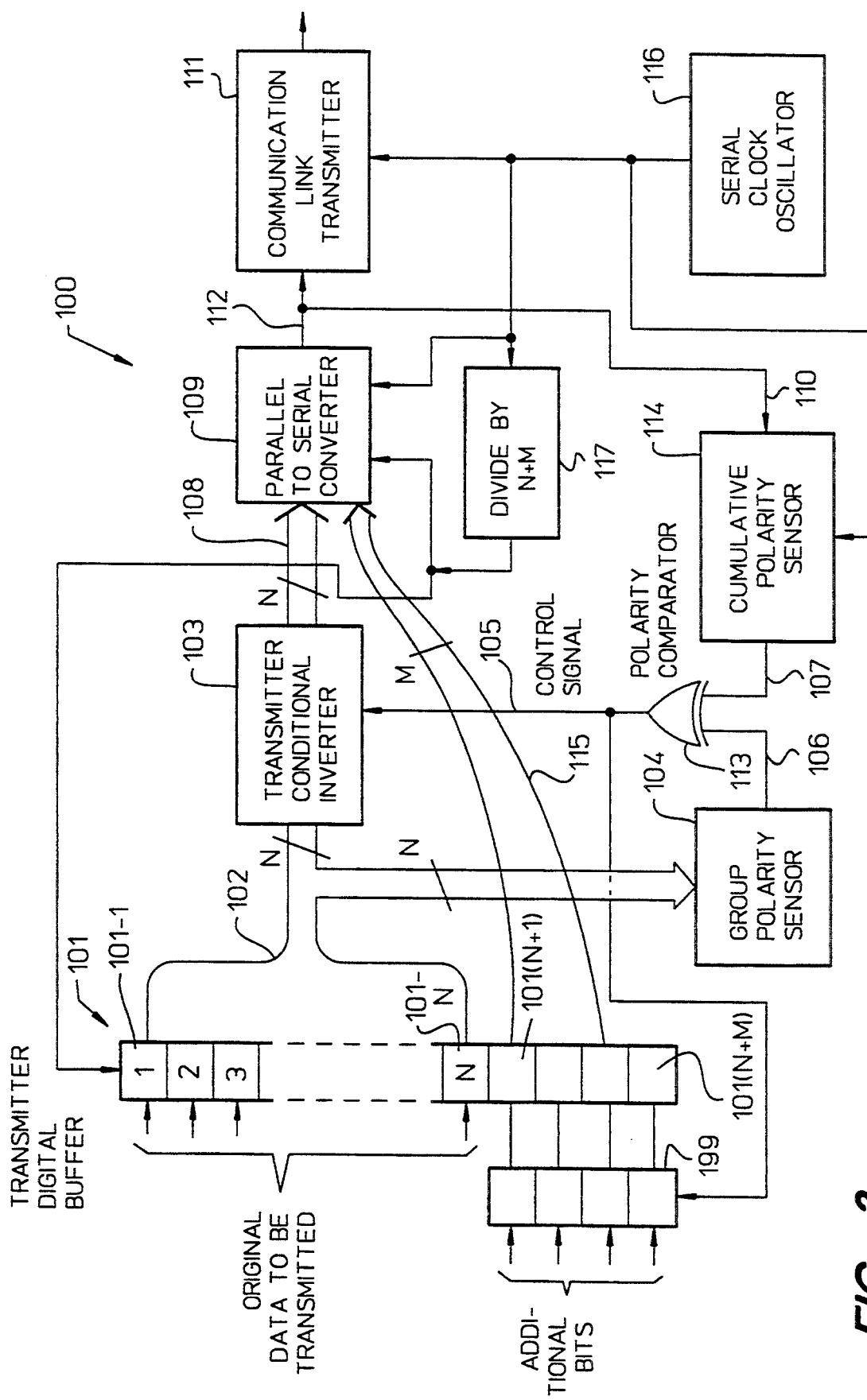
FIG. 3 is a block diagram of part of a transmitter that encodes information according to the method of the invention.

A transmitter circuit generally 100 is shown in FIG. 3. The data word, control word or fill pattern to be transmitted is provided as an N-bit word in a bank of N cells 101-1 through 101-N of a buffer 101. The additional bits are provided as M bits in a bank of M cells 101-(N+1) through 101-(N+M). The N bits of the word to be transmitted are clocked out simultaneously (for example, under control of a serial clock oscillator 116) to a transmitter conditional inverter 103 and a group polarity sensor 104 through an N-bit bus 102. The group polarity sensor 104 senses the polarity of the N-bit word. A parallel-to-serial converter 109 receives the N-bit word from the transmitter conditional inverter 103 through a bus 108; the converter 109 receives the M additional bits through a bus 115. The converter 109 (together with a divider 117) provides a serial data stream on an output lead 112 for driving a communication link transmitter 111. The output signals from the parallel-to-serial converter 109 are also applied to a cumulative polarity sensor 114 through a lead 110. The polarity sensors 104 and 114 provide their outputs to a polarity comparator 113 through leads 106 and 107, respectively. The polarity comparator 113 produces a control signal on a lead 105 which in turn drives the transmitter conditional inverter 103. Optionally, an additional encoder 199 is used to modify the M additional bits according whether or not the N data bits are or are not inverted.

Figure 4:
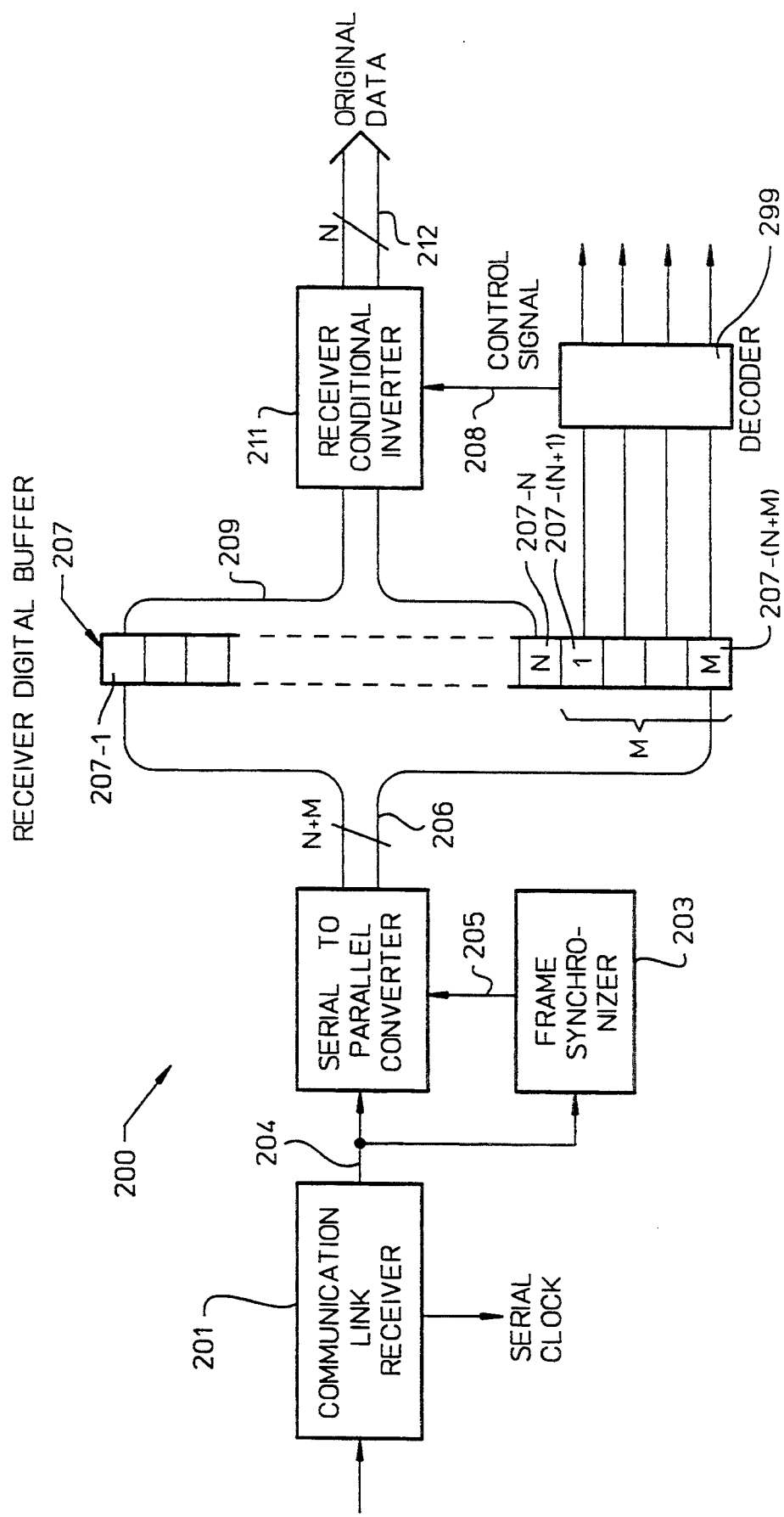
FIG. 4 is a block diagram of part of a receiver that decodes the encoded information as received from a transmitter of the kind shown in FIG. 2.

A receiver circuit generally 200 is shown in FIG. 4. The received serial signal is applied from a communication link receiver 201 to a serial-to-parallel converter 202 through a lead 204. Parallel data from the converter 202 is loaded through a bus 206 into a receiver digital buffer 207 consisting of N+M cells 207-1 through 207-(N+M). The serial data from the receiver 201 is also applied to a frame synchronizer 203. The output signal on a lead 205 from the synchronizer 203 defines the boundaries of each frame. This output signal is applied to the serial-to-parallel converter 202 in proper phase with respect to the serial data to ensure that the first bit of each frame is stored in cell 207-1, and so on. The data from the cells 207-1 through 207-N are applied to a receiver conditional inverter 211 through a bus 209. The conditional inverter 211 provides the original data on an output bus 212. A decoder 299 decodes the M additional bits and provides a control signal on a lead 208 to the conditional inverter 211.

From the foregoing it will be apparent that the invention provides a novel and advantageous method of encoding data for very high speed data transmission in balanced form and with a minimum of overhead for receiver synchronization and control.

Although certain specific embodiments of the invention have been described, the invention is not to be limited to the specific forms or arrangements of parts so described, and various modifications and changes can be made without departing from the scope and spirit of the invention. Within the scope of the appended claims, therefore, the invention may be practiced otherwise than as specifically described.

TABLE 1

| M Appended bits | | | | N Data Bits | Data Status | phantom bit Status |
|---|---|---|---|---|---|---|
| m1 | m2 | m3 | m4 | A B C D E F G H I J K L M N O P | | |
| 1 | 1 | 0 | 1 | X X X X X X X X X X X X X X X X | TRUE | first value |
| 0 | 0 | 1 | 0 | X X X X X X X X X X X X X X X X | INVERTED | first value |
| 1 | 0 | 1 | 1 | X X X X X X X X X X X X X X X X | TRUE | second value |
| 0 | 1 | 0 | 0 | X X X X X X X X X X X X X X X X | INVERTED | second value |

TABLE 2

| M Appended Bits | | | | N Data Bits | Control Word Status |
|---|---|---|---|---|---|
| m1 | m2 | m3 | m4 | A B C D E F G H I J K L M N O P | |
| 0 | 0 | 1 | 1 | X X X X X X X 0 1 X X X X X X X | TRUE |
| 1 | 1 | 0 | 0 | X X X X X X X 1 0 X X X X X X X | INVERTED |

TABLE 3

| M Appended Bits | | | | N Data Bits | Comments |
|---|---|---|---|---|---|
| m1 | m2 | m3 | m4 | A B C D E F G H I J K L M N O P | |
| 0 | 0 | 1 | 1 | 1 1 1 1 1 1 1 1 0 0 0 0 0 0 0 0 | Fill Word 0 |

TABLE 4

| M Appended Bits | | | | N Data Bits | Comments |
|---|---|---|---|---|---|
| m1 | m2 | m3 | m4 | A B C D E F G H I J K L M N O P | |
| 0 | 0 | 1 | 1 | 1 1 1 1 1 1 1 1 1 0 0 0 0 0 0 0 | Fill Word 1a |
| 0 | 0 | 1 | 1 | 1 1 1 1 1 1 1 1 0 0 0 0 0 0 0 0 | Fill Word 1b |

TABLE 5

| M Appended Bits | | | | N Data Bits |
|---|---|---|---|---|
| m1 | m2 | m3 | m4 | A B C D E F G H I J K L M N O P |
| 1 | 1 | 0 | 0 | X X X X X X X 0 0 X X X X X X X |
| 1 | 1 | 0 | 0 | X X X X X X X 0 1 X X X X X X X |
| 1 | 1 | 0 | 0 | X X X X X X X 1 1 X X X X X X X |
| 1 | 0 | 1 | 0 | X X X X X X X X X X X X X X X X |
| 0 | 1 | 0 | 1 | X X X X X X X X X X X X X X X X |
| 0/1 | 1 | 1 | 0/1 | X X X X X X X X X X X X X X X X |
| 0/1 | 0 | 0 | 0/1 | X X X X X X X X X X X X X X X X |

TABLE 6

| "M Appended Bits" | | | | "N Data Bits" | | | | | | | | | | | | | | | | Comments |
|---|---|---|---|---|---|---|---|---|---|---|---|---|---|---|---|---|---|---|---|---|
| m1 | m2 | m3 | m4 | A | B | C | D | E | F | G | H | I | J | K | L | M | N | O | P | Unscrambled bit stream |
| m1 | m2 | m3 | A | m4 | B | C | D | E | F | G | H | I | J | K | L | M | N | O | P | Scramble 1 |
| m1 | m2 | m3 | B | A | m4 | C | D | E | F | G | H | I | J | K | L | M | N | O | P | Scramble 2 |
| I | m2 | m3 | A | B | C | D | E | F | G | H | m1 | J | K | L | M | N | O | P | | Scramble 3 |
| J | m2 | m3 | m4 | A | B | C | D | E | F | G | H | I | m1 | K | L | M | N | O | P | Scramble 4 |
| I | m2 | m3 | A | m4 | B | C | D | E | P | G | H | m1 | J | K | L | M | N | O | P | Scramble 5 |

We claim:

1. A method of encoding a digital bit stream for transmission over a communication link, the method comprising:

maintaining a cumulative polarity indicative of bits which have been transmitted over the link during a predefined time interval, the cumulative polarity being positive if more logical one bits than logical zero bits have been transmitted and negative if fewer logical one bits than logical zero bits have been transmitted;

obtaining a plurality of data bits from the stream for transmission as a data word;

forming a frame by combining the data bits of the data word with a plurality of additional bits, a predetermined first selected bit of the additional bits having a logical value opposite a second selected bit adjacent to the first selected bit such that the first selected bit and the second selected bit establish a master transition in a predetermined location in the frame;

selecting a third bit immediately preceding the first selected bit, and selecting a fourth bit immediately following the second selected bit;

setting the third selected bit to the same logical value as the first selected bit in various ones of a plurality of frames, and setting the fourth selected bit to the same logical value as the second selected bit in various ones of a plurality of flames such that the master transition is not always immediately preceded or immediately followed by another transition; and setting the logical values of the combined bits such that the frame has a different polarity than the cumulative polarity, the frame polarity being positive if the frame contains more logical one bits than logical zero bits and negative if the frame contains fewer logical one bits than logical zero bits.

2. A method as in claim 1 wherein the value of at least one of the third and fourth selected bits is encoded to indicate the logical value of the phantom bit.

3. A method as in claim 1 wherein setting the logical values comprises determining whether the frame polarity is the same as the cumulative polarity, and, if so, inverting the logical values of the data bits and encoding the additional bits to indicate that the logical values of the data bits have been inverted.

4. A method as in claim 1 wherein setting the logical values comprises inverting the logical values of all the bits if, but for such inversion, the frame polarity would be the same as the cumulative polarity.

5. A method as in claim 1 and further comprising encoding the additional bits in each of a plurality of frames according to a predetermined error-checking pattern.

6. A method as in claim 5 and further comprising checking a plurality of received frames for errors by comparing the additional bits in the received frames with said error-checking pattern.

7. A method as in claim 1 and further comprising scrambling the order of the bits of the frame according to a predetermined security pattern to form a scrambled frame, transmitting the scrambled frame, receiving the scrambled frame, and unscrambling the order of the bits in the received frame according the said predetermined security pattern to recover the original frame.

8. A method as in claim 1 and further comprising checking the existence of master transitions in received data words to maintain synchronization.

9. A method of encoding a digital bit stream for transmission over a communication link, the method comprising:
   maintaining a cumulative polarity indicative of bits which have been transmitted over the link during a predefined interval, the cumulative polarity being positive if more logical one bits than logical zero bits have been transmitted and negative if fewer logical one bits than logical zero bits have been transmitted;
   selecting a word from among a plurality of data bits from the stream, a plurality of control bits, and a predefined fill word bit pattern;
   forming a frame by combining the bits of the selected word with a plurality of additional bits, a predetermined first selected bit of the additional bits having a logical value opposite a second selected bit adjacent to the first selected bit such that the first selected bit and the second selected bits establish a master transition in a predetermined location in the frame,
   selecting a third bit immediately preceding the first selected bit, and selecting a fourth bit immediately following the second selected bit;
   setting the third selected bit to the same logical value as the first selected bit in various ones of a plurality of frames, and setting the fourth selected bit to the same logical value as the second selected bit in various ones of a plurality of frames such that the master transition is not always immediately preceded or immediately followed by another transition; and
   if the selected word is a data word or a control word, setting the logical values of the combined bits such that the frame has a different polarity than the cumulative polarity, the frame polarity being positive if the frame contains more logical one bits than logical zero bits and negative if the frame contains fewer logical one bits than logical zero bits.

10. A method as in claim 9 and further comprising setting the logical values of the additional bits to indicate which type of word has been selected.

11. A method as in claim 10 and further comprising, if the selected word is a control word, setting the logical value of one of the bits of the control word to indicate that the word is a control word as opposed to a fill word.

12. A method as in claim 9 and further comprising, if the selected word is a fill word, setting the logical values of the combined bits such that the frame contains not more than one transition in addition to the master transition.

13. A method as in claim 9 and further comprising, if the selected word is a fill word, setting the logical values of the combined bits such that the frame contains an equal quantity of logical one bits and logical zero bits.

14. A method as in claim 9 wherein, if the selected word is a fill word, forming the frame comprises selecting one fill word pattern from a group of more than one predefined fill word patterns wherein the group of predefined fill patterns comprises at least one predefined fill word pattern having more zeros than ones, at least one predefined fill word pattern having more ones than zeroes, and wherein the total quantity of ones in all of the predefined fill word patterns in the group is equal to the total quantity of zeros in all of the predefined fill word patterns in the group.

15. A method as in claim 14 and further comprising selecting a frame pattern having a different polarity than the cumulative polarity.

16. A method as in claim 14 and further comprising selecting a plurality of fill words for sequential transmission by alternating between two of the predefined fill word patterns.

17. A method as in claim 9 wherein the value of at least one of the third and fourth selected bits is encoded to indicate the logical value of the phantom bit.

18. A method as in claim 9 wherein setting the logical values comprises inverting the logical values of the data bits and encoding the additional bits to indicate whether the logical values of the data bits have been inverted if, but for such inversion and encoding, the frame polarity would be the same as the cumulative polarity.

19. A method as in claim 9 wherein setting the logical values comprises inverting the logical values of all the bits if, but for such inversion, the frame polarity would be the same as the cumulative polarity.

20. A method as in claim 9 and further comprising encoding the additional bits in each of a plurality of frames according to a predetermined error-checking pattern.

21. A method as in claim 20 and further comprising checking a plurality of received frames for errors by comparing the additional bits in the received frames with said error-checking pattern.

22. A method as in claim 9 and further comprising scrambling the order of the bits of the frame according to a predetermined security pattern to form a scrambled frame, transmitting the scrambled frame, receiving the scrambled frame, and unscrambling the order of the bits in the received frame according the said predetermined security pattern to recover the original frame.

23. A method as in claim 9 and further comprising checking the polarity of a master transition in a received fill word to obtain synchronization and checking the existence of master transitions in received data and control words to maintain synchronization.

* * * * *